United States Patent
Kim et al.

(10) Patent No.: US 10,777,387 B2
(45) Date of Patent: Sep. 15, 2020

(54) APPARATUS FOR TREATING SUBSTRATE

(71) Applicant: SEMES CO., LTD., Chungcheongnam-do (KR)

(72) Inventors: Hyung Joon Kim, Gyeonggi-do (KR); Seung Pyo Lee, Seoul (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 933 days.

(21) Appl. No.: 14/039,558

(22) Filed: Sep. 27, 2013

(65) Prior Publication Data

US 2014/0090783 A1 Apr. 3, 2014

(30) Foreign Application Priority Data

Sep. 28, 2012 (KR) .................. 10-2012-0108998
Dec. 28, 2012 (KR) .................. 10-2012-0156272

(51) Int. Cl.
*H01J 37/32* (2006.01)

(52) U.S. Cl.
CPC ...... *H01J 37/321* (2013.01); *H01J 37/32082* (2013.01); *H01J 37/32633* (2013.01); *H01J 37/32651* (2013.01)

(58) Field of Classification Search
CPC .......... C23C 16/4404; C23C 16/45591; C23C 16/505; H01J 37/321–32119; H01J 37/32477–32504; H01J 37/32633; H01J 37/32651; H01J 2237/026–0268; H05H 2001/4645–4667
See application file for complete search history.

(56) References Cited

U.S. PATENT DOCUMENTS

| | | | | |
|---|---|---|---|---|
| 5,683,537 A * | 11/1997 | Ishii | .................. | H01J 37/32082 |
| 6,423,177 B1 * | 7/2002 | Tamitani | ............ | C23C 16/4417 |
| 6,518,195 B1 * | 2/2003 | Collins | .................. | C23C 16/507 |
| | | | | 257/E21.252 |
| 6,531,029 B1 * | 3/2003 | Ni | .......................... | H01J 37/321 |
| | | | | 118/723 I |
| 2002/0189762 A1 * | 12/2002 | Kim | .................... | C23C 16/4412 |
| | | | | 156/345.47 |
| 2003/0084999 A1 * | 5/2003 | Parsons | ............. | H01J 37/32082 |
| | | | | 156/345.43 |

(Continued)

FOREIGN PATENT DOCUMENTS

| | | |
|---|---|---|
| KR | 1020030009909 A | 2/2003 |
| KR | 1020080098985 A | 11/2008 |

*Primary Examiner* — Benjamin Kendall
(74) *Attorney, Agent, or Firm* — Carter, DeLuca & Farrell LLP (57) ABSTRACT

The present invention disclosed herein relates to a substrate treating apparatus, and more particularly, to an apparatus for treating a substrate using plasma. Embodiments of the present invention provide substrate treating apparatuses including a chamber having a treating space defined therein, a support member disposed in the chamber to support a substrate, a gas supply unit supplying a gas into the chamber, a plasma source generating plasma from the gas supplied into the chamber, a baffle disposed to surround the support member in the chamber and having through holes to exhaust a gas in the treating space, and a shielding unit preventing an electromagnetic field from an inside of the chamber to an outside of the chamber.

18 Claims, 5 Drawing Sheets

(56) References Cited

U.S. PATENT DOCUMENTS

| | | | | |
|---|---|---|---|---|
| 2004/0026233 | A1* | 2/2004 | Perrin | H01J 37/3405 |
| | | | | 204/192.12 |
| 2004/0060658 | A1* | 4/2004 | Nishimoto | H01J 37/32623 |
| | | | | 156/345.1 |
| 2005/0103443 | A1* | 5/2005 | Ishii | H01J 37/321 |
| | | | | 156/345.48 |
| 2006/0011299 | A1* | 1/2006 | Condrashoff | H01J 37/32834 |
| | | | | 156/345.47 |
| 2010/0055298 | A1* | 3/2010 | Sommers | C23C 14/564 |
| | | | | 427/58 |
| 2011/0005685 | A1* | 1/2011 | Nguyen | H01J 37/16 |
| | | | | 156/345.43 |
| 2012/0073757 | A1* | 3/2012 | Yamazawa | H01J 37/3211 |
| | | | | 156/345.48 |
| 2012/0247667 | A1* | 10/2012 | Hashiguchi | H01J 37/32477 |
| | | | | 156/345.3 |

* cited by examiner

APPARATUS FOR TREATING SUBSTRATE

CROSS-REFERENCE TO RELATED APPLICATIONS

This U.S. non-provisional patent application claims priority under 35 U.S.C. § 119 of Korean Patent Application Nos. 10-2012-0108998, filed on Sep. 28, 2012, and 10-2012-0156272, filed on Dec. 28, 2012, the entire contents of which are hereby incorporated by reference.

BACKGROUND OF THE INVENTION

The present invention disclosed herein relates to a substrate treating apparatus, and more particularly, to an apparatus for treating a substrate using plasma.

To manufacture a semiconductor device, various processes such as photolithography, etching, ashing, ion implantation, thin film deposition, cleaning, etc. are performed with respect to a substrate to form a desired pattern on the substrate. Among such processes, the etching is a process for removing a selected region from a layer formed on the substrate, and includes a wet etching and a dry etching.

For the dry etching, an etching apparatus using plasma is used. To generate plasma, an electromagnetic field is formed in an inner space of a chamber and a process gas supplied into the chamber is excited to a plasma state.

Plasma refers to an ionized gas state including ions, electrons, radicals, etc. Plasma is generated by a very high temperature, a strong electric field, or an RF electromagnetic field. In a semiconductor device manufacturing process, an etching is performed using plasma. The etching is performed by ion particles included in plasma colliding with the substrate.

In general, an electromagnetic field is not positioned only on the substrate. The electromagnetic field may be supplied into a region below the substrate and to a region outside the chamber. Thus, since the electromagnetic field is not focused on an upper side of the substrate, efficiency in substrate treatment using plasma is reduced.

SUMMARY OF THE INVENTION

The present invention provides a substrate treating apparatus that may focus an electromagnetic field generating plasma on a region where a substrate is positioned, in a process of treating the substrate using plasma.

The present invention also provides a substrate treating apparatus that may enhance efficiency in the process of treating a substrate using plasma.

The feature of the present invention is not limited to the aforesaid, but other features not described herein will be clearly understood by those skilled in the art from descriptions below.

Embodiments provide surface treating apparatuses.

Embodiments of the present invention provide substrate treating apparatuses including a chamber having a treating space defined therein, a support member disposed in the chamber to support a substrate, a gas supply unit supplying a gas into the chamber, a plasma source generating plasma from the gas supplied into the chamber, a baffle disposed to surround the support member in the chamber and having through holes to exhaust a gas in the treating space, and a shielding unit preventing an electromagnetic field from an inside of the chamber to an outside of the chamber.

In some embodiments, the shielding unit may include a first shielding member surrounding a peripheral surface of the chamber.

In other embodiments, the first shielding member may be provided at a height corresponding to the support member.

In still other embodiments, the first shielding member may be provided such that a bottom thereof surrounds the baffle.

In even other embodiments, the above substrate treating apparatus may further include a liner contacting an inner sidewall of the chamber and provided to surround the inside of the chamber.

In yet other embodiments, the first shielding member may be provided between the liner and the inner sidewall of the chamber.

In further embodiments, the first shielding member may be provided at a position adjacent to the baffle.

In still further embodiments, the first shielding member may be positioned inside the chamber.

In even further embodiments, the shielding unit may further include a second shielding member, and the second shielding member may be positioned lower than a top surface of the support member.

In yet further embodiments, the second shielding member may be provided such that a top surface thereof contacts a bottom surface of the baffle.

In much further embodiments, the second shielding member may have the same sectional area as the baffle, and may have a hole which is provided at the same position as a through hole of the baffle.

In still much further embodiments, the shielding unit may further include a third shielding member, the plasma source may include an antenna positioned at a top portion of the chamber, and an antenna room having an inner space where the antenna is positioned, and the third shielding member may be provided to surround a peripheral surface of the antenna room.

In even much further embodiments, the above substrate treating apparatus may further include a reflective plate positioned above the antenna inside the antenna room to reflect an electromagnetic wave, which travels upward from the antenna, in a downward direction.

In yet much further embodiments, the third shielding member may be provided to surround an outer peripheral surface of the antenna room.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

The embodiments of the present invention may be modified in various forms, and the scope of the present invention should not be construed as limited to the following embodiments. These embodiments are provided so that this disclosure will more fully convey the concept of the invention to those skilled in the art. In the figures, the dimensions of layers and regions are exaggerated for clarity of illustration.

Figure 1:
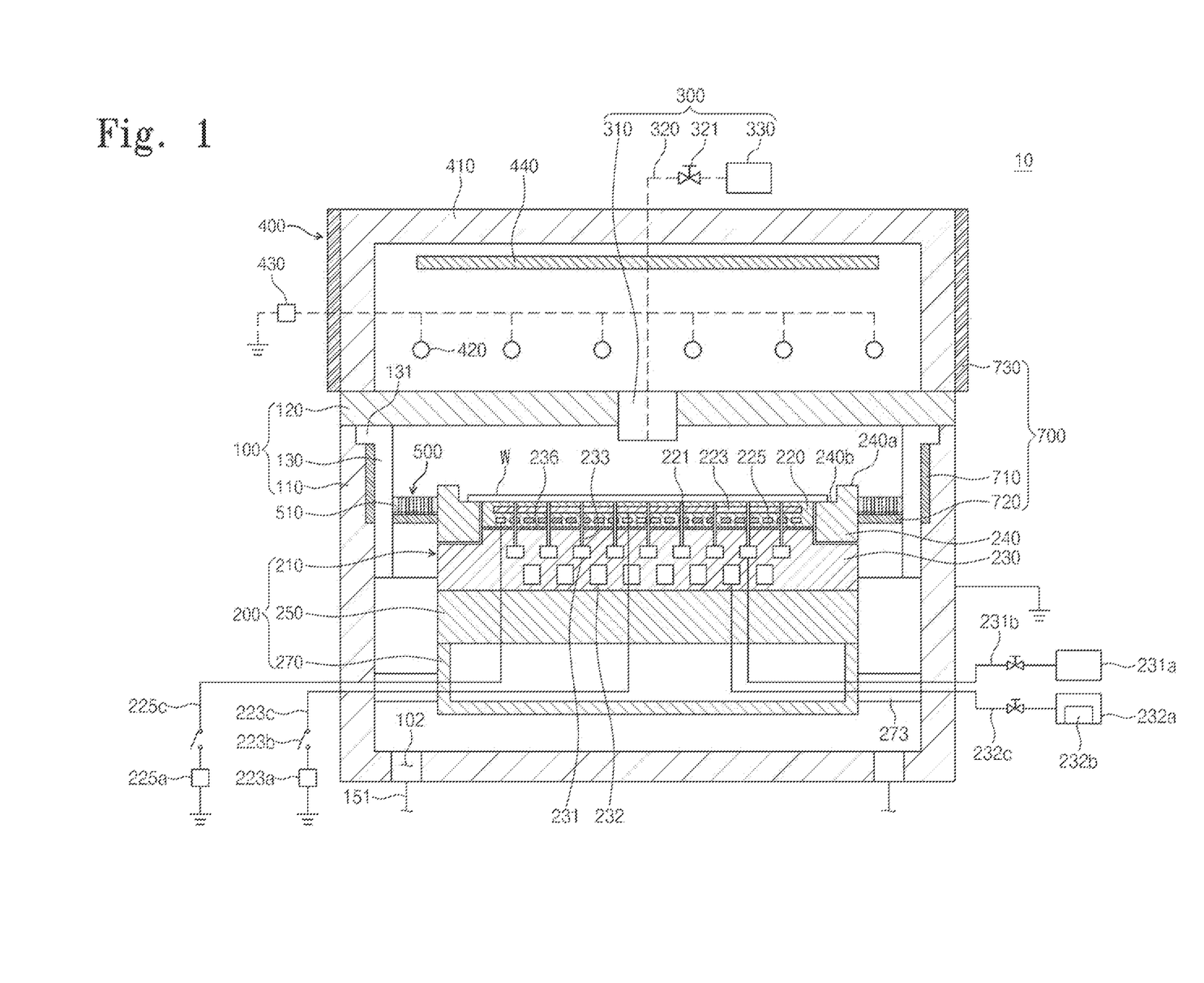
FIG. 1 is a cross-sectional view illustrating a substrate treating apparatus according to an embodiment of the present invention.

FIG. 1 is a cross-sectional view illustrating a substrate treating apparatus according to an embodiment of the present invention.

Referring to FIG. 1, a substrate treating apparatus 10 treats a substrate (W) using plasma. For example, the substrate treating apparatus 10 may perform an etching process with respect to the substrate (W). The substrate treating apparatus 10 includes a chamber 100, a support member 200, a gas supply unit 300, a plasma source 400, a baffle unit 500, and a shielding unit 700.

The chamber 100 provides a space where a substrate treating process is performed. The chamber 100 includes a housing 110, a seal cover 120, and a liner 130.

The housing 110 has an inner space of which top is opened. The inner space of the housing 110 is provided as a space where the substrate treating process is performed. The housing 110 is formed of a metal material. The housing 110 may be formed of an aluminum material. The housing 110 may be grounded. An exhaust hole 102 is formed at a bottom surface of the housing 110. The exhaust hole 102 is connected to an exhaust line 151. A reaction byproduct generated from a manufacturing process, and a gas staying in the inner space of the housing 110 may be exhausted to the outside through the exhaust line 151. The inside of the housing 110 is depressurized to a predetermine pressure by the exhausting process.

The seal cover 120 covers the opened top surface of the housing 110. The seal cover 120 is provided in a plate shape to seal the inner space of the housing 110. The seal cover 120 may include a dielectric substance window.

The liner 130 is provided inside the housing 110. The liner 130 has an inner space of which top and bottom are opened. The liner 130 may be provided in a cylindrical shape. The liner 130 may have a radius corresponding to an inner circumference. The liner 130 is provided along the inner peripheral surface of the housing 110. A support ring 131 is disposed on a top of the liner 130. The support ring 131 is provided in a ring-shaped plate and protruded toward the outside of the liner 130 along the circumference of the liner 130. The support ring 131 is placed on the top of the housing 110 to support the liner 130. The liner 130 may be formed of the same material as the housing 110. The liner 130 may be formed of an aluminum material. The liner 130 protects the inner peripheral surface of the housing 110. Arc discharge may be generated in the chamber 100 while the process gas is excited. The arc discharge damages peripheral devices. The liner 130 protects the inner circumferential surface of the housing 110 and prevents the inner circumferential surface from being damaged due to arc discharge. The liner 130 also prevents impurities generated in a substrate treating process from being deposited on an inner sidewall of the housing 110. The liner 130 is inexpensive compared with the housing 110 and is easily exchangeable.

Therefore, when the liner 130 is damaged due to arc discharge, an operator may exchange the damaged liner 130 with a new liner.

A support member 200 is positioned inside the housing 110. The support member 200 supports the substrate (W). The support member 200 may include an electrostatic chuck 210 adsorbing the substrate (W) using an electrostatic force. Unlike this, the support member 200 may support the substrate (W) in various ways such as a mechanical clamping. Hereinbelow, the support member 200 including the electrostatic chuck 210 will be described.

The support member 200 includes the electrostatic chuck 210, an insulation plate 250, and a lower cover 270. The support member 200 is positioned spaced apart upward from the bottom of the housing 110 within the chamber 100.

The electrostatic chuck 210 includes a dielectric plate 220, an electrode 223, a heater 225, a support plate 230, and a focus ring 240.

The dielectric plate 220 is positioned at an upper end of the electrostatic chuck 210. The dielectric plate 220 is formed of a dielectric substance having a disc shape. The substrate (W) is placed on the dielectric plate 220. The top surface of the dielectric plate 220 has a radius that is smaller than that of the substrate (W). Thus, an edge region of the substrate (W) is positioned outside the dielectric plate 220. The dielectric plate 220 is formed with a first supply flow passage 221. The first supply flow passage 221 is formed extending from the top surface of the dielectric plate 210 to the bottom surface. The first supply flow passage 221 is formed in plurality, and the plurality of the first supply flow passages 221 are spaced apart from each other and are provided as passages through which a heat transfer medium is supplied to a bottom surface of the substrate (W).

The lower electrode 223 and the heater 225 are buried in the dielectric plate 220. The lower electrode 223 is positioned above the heater 225. The lower electrode 223 is electrically connected to a first lower power 223a. The first lower power 223a includes a DC power. A switch 223b is installed between the lower electrode 223 and the first lower power 223a. The lower electrode 223 may be electrically connected to the first lower power 223a by On/Off of the switch 223b. When the switch 223b is turned On, DC current is applied to the lower electrode 223. By the DC current applied to the lower electrode 223, an electrostatic force acts between the lower electrode 223 and the substrate (W) so that the substrate (W) is adsorbed on the dielectric plate 220 by the electrostatic force.

The heater 225 is electrically connected to a second lower power 225a. The heater 225 resists current applied from the second lower power 225a to generate heat. The generated heat is transferred into the substrate (W) through the dielectric plate 220. The substrate (W) is maintained at a predetermined temperature by the heat generated in the heater 225. The heater 225 includes a spiral coil.

The support plate 230 is positioned under the dielectric plate 220. The bottom surface of the dielectric plate 220 and the top surface of the support plate 230 may be adhered by adhesive 236. The support plate 230 may be formed of an aluminum material. The top surface of the support plate 230 may be stepped such that a central region thereof is positioned at a higher level than an edge region thereof. The central region of the top surface of the support plate 230 has an area corresponding to a bottom surface of the dielectric plate 220, and is adhered to the bottom surface of the dielectric plate 220. A first circulation flow passage 231, a second circulation flow passage 232, and a second supply flow passage 233 are formed in the support plate 230.

The first circulation flow passage 231 is provided as a passage through which a heat transfer medium circulates. The first circulation flow passage 231 may be formed in a spiral shape within the support plate 230. Or, the first circulation flow passages 231 may be arranged such that ring-shaped flow passages having different radius have the same center. The respective the first circulation flow passages 231 may communicate with each other. The first circulation flow passages 231 are formed at the same height.

The second circulation flow passage 232 is provided as a passage through which a cooling fluid circulates. The second circulation flow passage 232 may be formed in a spiral shape within the support plate 230. Or, the second circulation flow passages 232 may be arranged such that ring-shaped flow passages having different radius have the same center. The respective the second circulation flow passages 232 may communicate with each other. The second circulation flow passage 232 may have a cross-section area larger than that of the first circulation flow passage 231. The second circulation flow passages 232 are formed at the same height. The second circulation flow passage 232 may be positioned under the first circulation flow passage 231.

The second supply flow passage 233 extends upward from the first circulation flow passage 231 to the top surface of the support plate 230. The second supply passage 233 is provided in the number corresponding to the first supply flow passage 221 and connects the first circulation flow passage 231 and the first supply flow passage 221.

The first circulation flow passage 231 is connected to a heat transfer medium storage unit 231a through a heat transfer medium supply line 231b. A heat transfer medium is stored in the heat transfer medium storage unit 231a. The heat transfer medium includes an inert gas. According to embodiments, the heat transfer medium includes helium (He) gas. Helium gas is supplied into the first circulation flow passage 231 through the supply line 231b, and then supplied to the bottom surface of the substrate (W) via the second supply flow passage 233 and the first supply flow passage 221 sequentially. Helium gas functions as a medium which allows heat transferred to the substrate (W) from plasma to be transferred to the electrostatic chuck 210.

The second circulation flow passage 232 is connected to a cooling fluid storage unit 232a through a cooling fluid supply line 232c. A cooling fluid is stored in the cooling fluid storage unit 232a. The cooling fluid storage unit 232a may be provided therein with a cooler 232b. The cooler 232b cools the cooling fluid to a predetermined temperature. Unlike this, the cooler 232b may be installed on the cooling fluid supply line 232c. The cooling fluid supplied into the second circulation flow passage 232 through the cooling fluid supply line 232c to circulate along the second circulation flow passage 232 and cool the support plate 230. The support plate 230 cools the dielectric plate 220 and the substrate (W) together to maintain the substrate (W) at a predetermined temperature while being cooled.

The focus ring 240 is disposed at an edge region of the electrostatic chuck 210. The focus ring 240 has a ring shape, and is disposed along the circumference of the dielectric plate 220. A top surface of the focus ring 240 may be stepped such that an outer portion 240a is positioned at a higher level than an inner portion 240b. An inner portion 240b of a top surface of the focus ring 240 is positioned at the same height as the top surface of the dielectric plate 220. The inner portion 240b of the top surface of the focus ring 240 supports an edge region of the substrate (W) positioned on the outer side of the dielectric plate 220. An outer side portion 240a of the focus ring 240 is provided to surround the edge region of the substrate (W). The focus ring 240 allows plasma to be focused on a region facing the substrate (W).

The insulation plate 250 is positioned under the support plate 230. The insulation plate 250 has a cross-section area corresponding to the support plate 230. The insulation plate 250 is positioned between the support plate 230 and the lower cover 270. The insulation plate 250 is formed of an insulation material and electrically insulates the support plate 230 and the lower cover 270.

The lower cover 270 is positioned at a lower position of the support member 200. The lower cover 270 is positioned spaced apart upward from the bottom surface of the housing 110. The lower cover 270 has an inner space of which top is opened. The top of the lower cover 270 is covered by the insulation plate 250. Therefore, an outer radius of the cross-section of the lower cover 270 may be equal in length as an outer radius of the insulation plate 250. A lift pin module (not illustrated) for moving the transferred substrate (W) from an outer transfer member to the electrostatic chuck 210 may be positioned in the inner space of the lower cover 270.

The lower cover 270 has a connecting member 273. The connecting member 273 connects an outer side surface of the lower cover 270 and an inner sidewall of the housing 110. The connecting member 273 may be provided in plurality and the plurality of the connecting members 273 may be spaced apart by a constant interval. The connecting member 273 supports the support member 200 within the chamber 100. Also, the connecting member 273 is connected to the inner sidewall of the housing 110 such that the lower cover 270 is electrically grounded. A first power line 223c connected to the first lower power 223a, a second power line 225c connected to the second lower power 225a, the heat transfer medium supply line 231b connected to the heat transfer medium storage unit 231a, and the cooling fluid supply line 232c connected to the cooling fluid storage unit 232a extend to the inside of the lower cover 270 through the inner space of the connecting member 273.

The gas supply unit 300 supplies a process gas into the chamber 100. The gas supply unit 300 includes a gas supply nozzle 310, a gas supply line 320, and a gas storage unit 330. The gas supply nozzle 310 is installed at a central portion of the seal cover 120. A spray hole is formed at a bottom surface of the gas supply nozzle 310. The spray hole is positioned under the seal cover to supply the process gas into the chamber 100. The gas supply line 320 connects the gas supply nozzle 310 and the gas storage unit 330. The gas supply line 320 supplies the process gas stored in the gas storage unit 330 to the gas supply nozzle 310. A valve 321 is installed on the gas supply line 320. The valve 321 opens/closes the gas supply line 320 and controls the flow rate of the process gas supplied through the gas supply line 320.

The plasma source 400 excites the process gas in the chamber to a plasma state. An inductively coupled plasma (ICP) source may be used as the plasma source 400. The plasma source 400 includes an antenna room 410, an antenna 420, and a plasma power 430. The antenna room 410 is provided in a cylindrical shape in which bottom is opened. The antenna room 410 has a space defined therein. The antenna room 410 is provided so as to have a diameter corresponding to that of the chamber 100. The bottom of the antenna room 410 is provided so as to be detachable from the seal cover 120. The antenna 420 is disposed in the antenna room 410. The antenna 420 is provided in a spiral shaped coil wound several times and connected to the plasma power 430. The antenna 420 receives power from the plasma power 430. The plasma power 430 may be positioned outside the chamber 100. The antenna 420 which receives power may form an electromagnetic field in a processing space of the chamber 100. The plasma gas is excited to a plasma state by the formed electromagnetic field.

The baffle unit 500 is positioned between the inner sidewall of the housing 110 and the support member 400. The baffle unit 500 includes a baffle 510 formed with a through hole 511. The baffle 510 is provided in a ring shape. The baffle 510 has the plurality of through holes 511. The process gas supplied into the housing 110 passes through the through holes 511 of the baffle 510 and is exhausted through the exhaust hole 102. The flow of the process gas may be controlled according to the shape and the baffle 510 and the shape of the through holes 511.

The shielding member 700 includes a first shielding member 710, a second shielding member 720, and a third shielding member 730. The shielding member 700 is formed of a material that is able to shield an electromagnetic field. In an example, the shielding member 700 may be formed of a material including any one of permalloy, Mu-metal, and iron (Fe).

Figure 2:
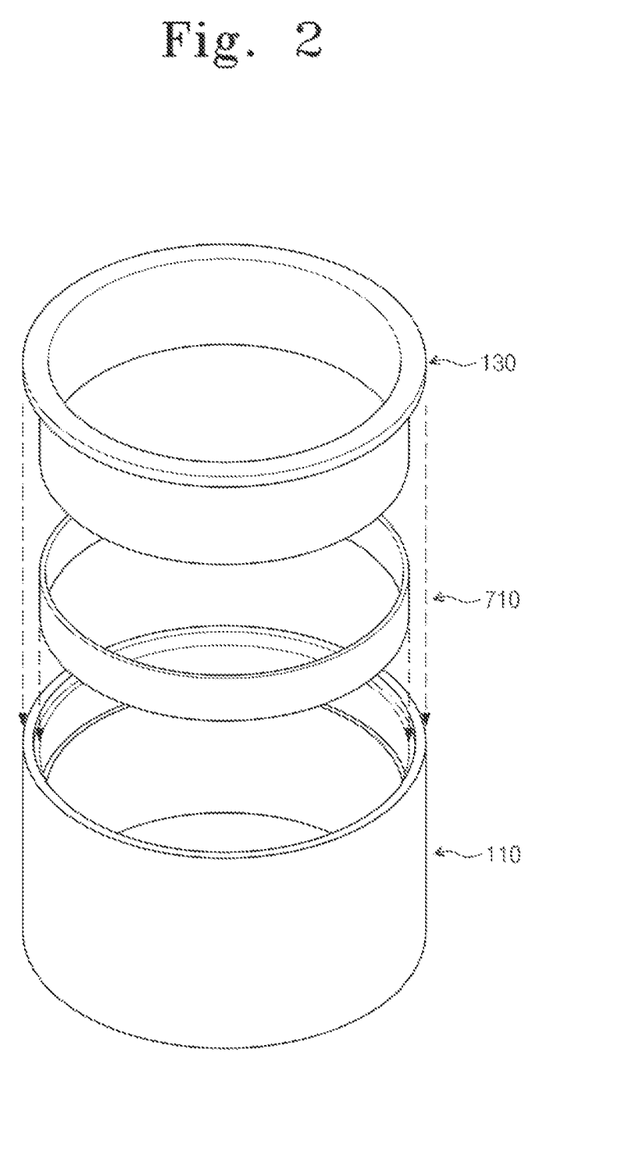
FIG. 2 is an exploded perspective view of the first shielding member illustrated in FIG. 1.
Figure 3:
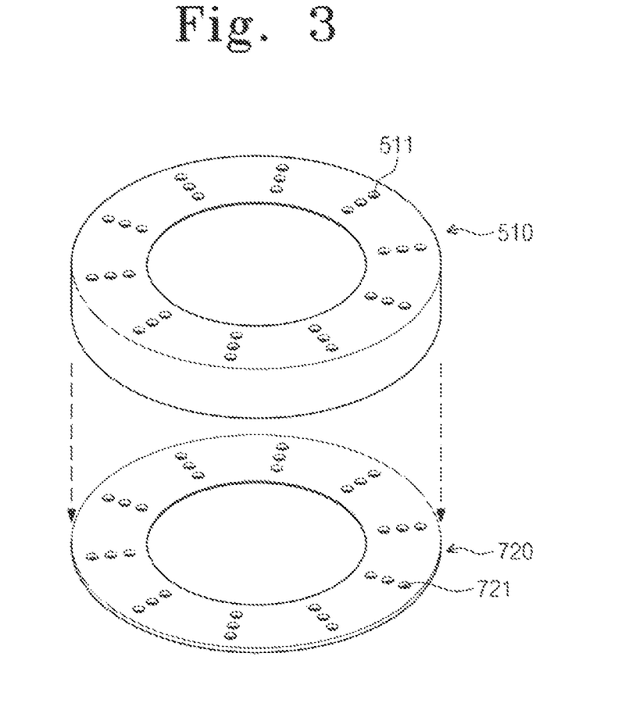
FIG. 3 is a detailed view of the first shielding member and the second shielding member illustrated in FIG. 1.

FIG. 2 is an exploded perspective view of the first shielding member illustrated in FIG. 1, and FIG. 3 is a detailed sectional view of the first shielding member and the second shielding member illustrated in FIG. 1.

Referring to FIGS. 2 and 3, the first shielding member 710 is provided in a shape surrounding the support member 200. The first shielding member 710 is provided in a cylindrical shape in which top and bottom are opened. The first shielding member 710 maybe provided in a shape surrounding a peripheral surface of the chamber 100. The first shielding member 710 may be provided in a state that an outer surface thereof is in contact with an inner circumferential surface of the housing 110. At this time, an outer diameter of the first shielding member 710 is equal in length to an inner diameter of the housing 110.

In an example, the first shielding member 710 may be provided between the liner 130 and the inner sidewall of the housing 110. In this case, the outer peripheral surface of the liner 130 contacts the inner sidewall of the first shielding member 710. The first shielding member 710 is provided extending in a direction parallel to the peripheral surface of the housing 110. The first shielding member 710 may be provided at a height corresponding to the support member 200. The bottom of the first shielding member 710 may be positioned lower than the substrate (W). In an example, the bottom of the first shielding member 710 may be provided at a position adjacent to the baffle 510. The top of the first shielding member 710 may be positioned higher than the substrate (W). Also, the first shielding member 710 may be provided so as to surround the baffle 510. In another example, the top of the first shielding member 710 may be provided so as to be connected to the seal cover 120. While the present embodiment describes that the first shielding member 710 is provided inside the chamber 100, the first shielding member 710 may be provided outside the chamber 100, unlike the present embodiment. In such a case, the first shielding member 710 maybe provided in a shape surrounding the outer peripheral surface of the chamber 110.

Figure 4:
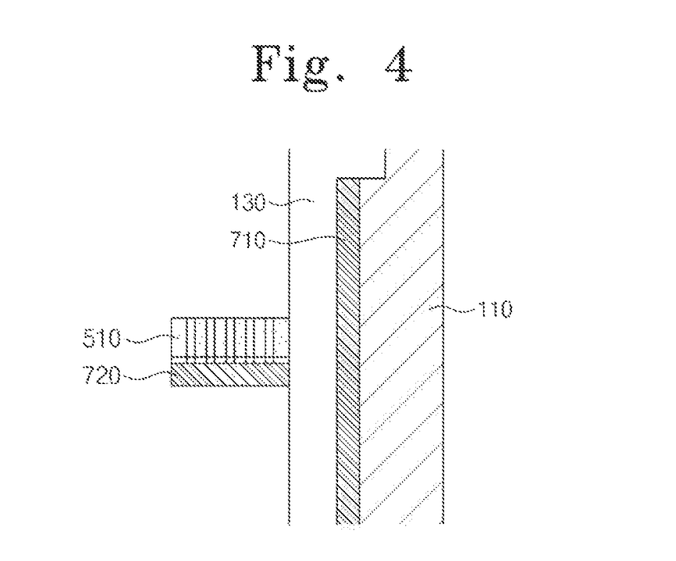
FIG. 4 is an exploded perspective view of the second shielding member illustrated in FIG. 1.

FIG. 3 is a detailed view of the first shielding member and the second shielding member illustrated in FIG. 1, and FIG. 4 is an exploded perspective view of the second shielding member illustrated in FIG. 1.

Referring to FIGS. 3 and 4, the second shielding member 720 is positioned lower than the top surface of the support member 200. The second shielding member 720 is provided in a plate shape surrounding the support member 200. In an example, the second shielding member 720 may be provided such that the top surface thereof contacts the bottom surface of the baffle 510. In this case, the second shielding member 720 may have the same diameter as the baffle (W). Also, the second shielding member 720 may have the same section area as the baffle 510, and may have holes 721 formed at the same positions as the through holes 511 of the baffle 510. Unlike this, the second shielding member 720 may be provided such that the bottom surface thereof contacts the bottom surface of the baffle 510.

Figure 5:
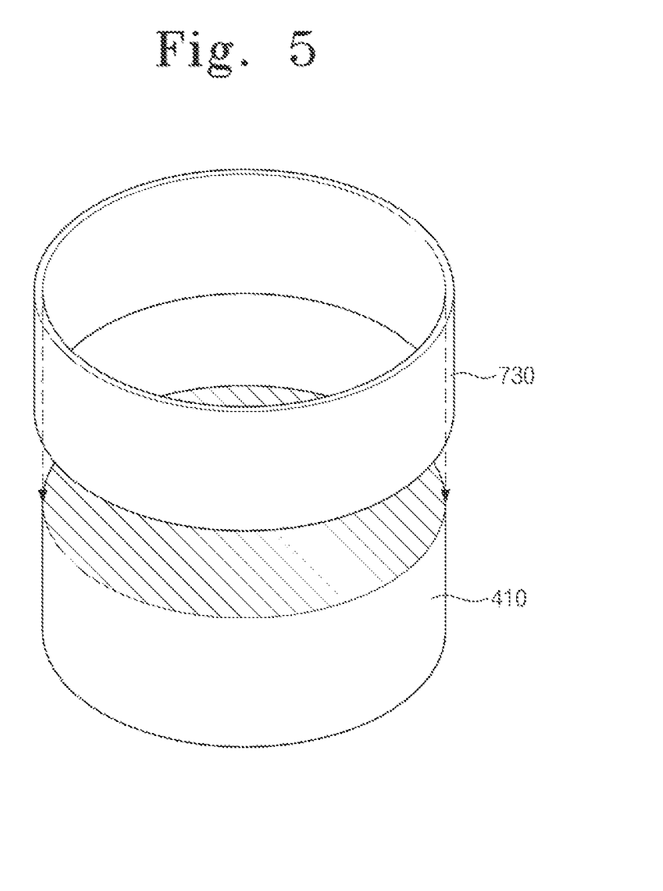
FIG. 5 is an exploded perspective view of the third shielding member illustrated in FIG. 1.

FIG. 5 is an exploded perspective view of the third shielding member illustrated in FIG. 1.

Referring to FIG. 5, the third shielding member 730 is provided in a shape surrounding the antenna room 410. The third shielding member 730 is provided in a shape in which top and bottom are opened. In an example, the third shielding member 730 may be provided in a shape surrounding an outer peripheral surface of the antenna room 410. The third shielding member 730 may be provided such that an inner side surface thereof contacts the outer side surface of the antenna room 410. Unlike this, the third shielding member 730 may be provided inside the antenna room 410. In this case, the third shielding member 730 may be provided such that the top is connected to a reflective plate 440. Alternatively, the third shielding member 730 may not be provided.

Figure 6:
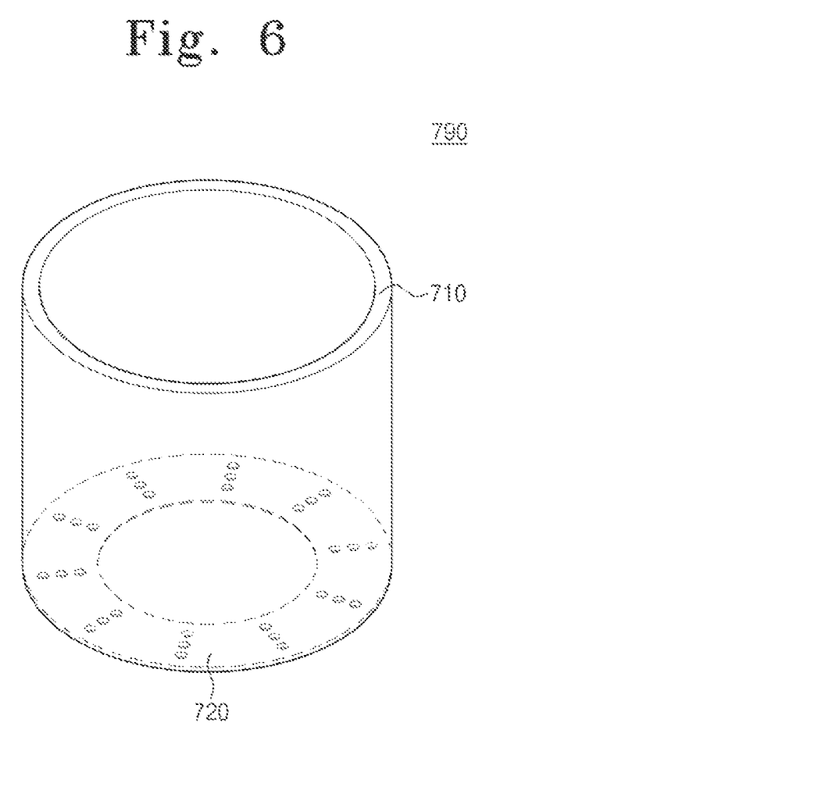
FIG. 6 is a perspective view illustrating a modified example of the shielding unit illustrated in FIG. 2.

FIG. 6 is a perspective view illustrating a modified example of the shielding unit illustrated in FIG. 2.

Referring to FIG. 6, the shielding unit 790 may be provided in a shape in which a first shielding member 710 and a second shielding member 720 are coupled. A bottom of the first shielding member 710 may be coupled to an edge region of the second shielding member 720. The shielding unit 790 may be provided in a cylindrical shape in which top is opened.

The above embodiment and modified embodiment have described that the inductively coupled plasma (ICP) source is used as the plasma source. Unlike these, a capacitively coupled plasma (CCP) source may be used as the plasma source.

Hereinbelow, a process of treating a substrate using the above-described substrate treating apparatus will be described.

When the substrate (W) is placed on the support member 200, a DC current is applied to the lower electrode 223 from the first lower power 223a. By the DC current applied to the lower electrode 223, an electrostatic force acts between the lower electrode 223 and the substrate (W) so that the substrate (W) is adsorbed to the electrostatic chuck 210 by the electrostatic force.

When the substrate (W) is adsorbed to the electrostatic chuck 210, a process gas is supplied into the housing 110 through the gas spray nozzle 310. And, an RF power generated in the plasma power 430 is applied to the inside of the housing 110 through the antenna 420. The applied RF power excites the process gas staying in the inside of the housing 110. The excited process gas is supplied onto the substrate (W) to treat the substrate (W). The excited process gas may perform an etching process.

The electromagnetic field generated in the antenna 420 is generally not positioned only on the top surface of the support member 200 inside the chamber 100. A portion of the electromagnetic field above the support member 200 excites plasma to perform the substrate treating process, but another portion may move to a region under the support member 200 and does not have an influence on the substrate treating process. Also, a portion of the electromagnetic field may be positioned outside the chamber 100.

According to the embodiment of the present invention, the first shielding member 710 shields the electromagnetic field from moving to the outside through a side surface of the chamber 100. Also, the second shielding member 720 shields the electromagnetic field from moving to a region under the support member 200. In this case, the density of the electromagnetic field may be increased at a position adjacent to the support member 200. Thus, the electromagnetic field generating plasma may be focused on the region where the substrate (W) is positioned. Therefore, efficiency in substrate treating process using plasma can be enhanced.

Also, the third shielding member 730 may shield the antenna room 410 to reduce loss of the electromagnetic field generated in the antenna 420. Thus, the electromagnetic field inside the antenna room 410 can move to the inside of the chamber to enhance the efficiency in substrate treating process using plasma.

As described above, according to embodiments of the present invention, an electromagnetic field generating plasma may be focused on a region where a substrate is positioned.

Also, according to embodiments of the present invention, efficiency in the process of treating a substrate using plasma may be enhanced.

The effects of the present invention are not limited to those described above, and other effects that are not mentioned will be clearly understood to a person skilled in the art from the present specification and the accompanying drawings.

The above-disclosed subject matter is to be considered illustrative, and not restrictive, and the appended claims are intended to cover all such modifications, enhancements, and other examples, which fall within the true spirit and scope of the present invention. Therefore, the embodiments disclosed in the present invention are not intended to limit the technical spirit of the present invention, but are intended to explain the technical idea of the invention. The technical spirit of the present invention is not limited to such embodiments. The protection scope of the present invention should be defined by the following claims, and all technical ideas within the scope will be construed as being included in the scope of the present invention.

What is claimed is:

1. A substrate treating apparatus comprising:
   a chamber having a treating space defined therein, the chamber having: a top portion having a first inner radius and a bottom portion having a second inner radius smaller than the first inner radius;
   a support member disposed in the chamber, the support member including a support plate to support a substrate and an electrostatic chuck positioned below the support plate;
   a gas supply unit supplying a gas into the chamber;
   a plasma source generating plasma from the gas supplied into the chamber, the plasma source including an antenna positioned above the chamber and an antenna room having a cylindrical shape and an inner space where the antenna is positioned;
   a baffle disposed to surround the support member in the chamber and having through holes to exhaust a gas in the treating space;
   a liner surrounded by the chamber, the liner having a ring shape and a protrusion extending outwardly from an upper portion of the ring shape; and
   a shielding unit configured to prevent an electromagnetic field from moving from an inside of the chamber to an outside of the chamber, the shielding unit including:
      a first shielding member disposed between the top portion of the chamber and the ring shape of the liner, the first shielding member having a ring shape and being supported by a top surface of the bottom portion of the chamber;
      a second shielding member contacting a bottom surface of the baffle, wherein the second shielding member is a plate formed from a material configured to shield an electromagnetic field, the second shielding member defining a plurality of holes that are aligned with the through holes of the baffle; and
      a third shielding member including a cylindrical structure provided to surround the cylindrical shape of the antenna room and a reflective plate positioned above the antenna within the inner space of the antenna room to reflect an electromagnetic wave,
   which travels upward from the antenna, in a downward direction,
   wherein an inner surface of the cylindrical structure of the third shielding member contacts an outer surface of the cylindrical shape of the antenna room,
   wherein an outside surface of the ring shape of the liner corresponds to the second inner radius of the chamber,
   wherein a bottom of the first shielding member is positioned lower than the second shielding member, and
   wherein the second shielding member is positioned above the electrostatic chuck to prevent the electromagnetic field from moving into the electrostatic chuck.

2. The substrate treating apparatus of claim 1, wherein the first shielding member is provided at a height corresponding to the support member.

3. The substrate treating apparatus of claim 1, wherein the second shielding member has the same sectional area as the baffle.

4. The substrate treating apparatus of claim 1, wherein the peripheral surface of the antenna room is an outer surface of the antenna room.

5. The substrate treating apparatus of claim 1, wherein the baffle is positioned between the support member and the first shielding member.

6. The substrate treating apparatus of claim 5,
   wherein the shielding unit further includes a third shielding member, the plasma source further includes an antenna positioned above the chamber, and an antenna room having an inner space where the antenna is positioned, and
   wherein the third shielding member is provided to surround an outer peripheral surface of the antenna room.

7. The substrate treating apparatus of claim 5, wherein the second shielding member has the same sectional area as the baffle.

8. The substrate treating apparatus of claim 7, further comprising an antenna room positioned above the chamber and having an antenna positioned therein, and wherein the shielding unit further includes a third shielding member provided to surround an outer peripheral surface of the antenna room.

9. The substrate treating apparatus of claim 1, wherein the second shielding member has a lateral side surface contacting the liner.

10. The substrate treating apparatus of claim 1, wherein the liner is removably coupled to the chamber.

11. The substrate treating apparatus of claim 1, wherein the liner is removably coupled to an inner peripheral surface of the first shielding member.

12. The substrate treating apparatus of claim 1, wherein the second shielding member is formed from at least one of permalloy or mu-metal.

13. The substrate treating apparatus of claim 1, wherein the top surface of the second shielding member directly contacts the bottom surface of the baffle.

14. The substrate treating apparatus of claim 1, wherein at least a portion of each of the liner, the first shielding member, and the second shielding member is aligned along a horizontal axis defined through the chamber.

15. The substrate treating apparatus of claim 1, wherein an inner side of the second shielding member is contacted with an outer side of the support member and an outer side of the second shielding member is contacted with an inner side of the liner.

16. The substrate treating apparatus of claim 1, further comprising a seal cover covering an open top surface of the chamber, wherein the seal cover includes a dielectric substance window.

17. The substrate treating apparatus of claim 16, wherein the seal cover contacts a top surface of the liner and the open top surface of the chamber.

18. The substrate treating apparatus of claim 1, wherein a bottom surface of the protrusion of the liner is in contact with a top surface of the first shielding member and a top surface of the top portion of the chamber.

* * * * *